United States Patent [19]
Tran

[11] Patent Number: 5,818,053
[45] Date of Patent: *Oct. 6, 1998

[54] MULTI-MODULE SOLID STATE RADIATION DETECTOR WITH CONTINUOUS PHOTOCONDUCTOR LAYER AND FABRICATION METHOD

[75] Inventor: Nang Tri Tran, Cottage Grove, Minn.

[73] Assignee: Imation Corp., Oakdale, Minn.

[*] Notice: The term of this patent shall not extend beyond the expiration date of Pat. No. 5,254,480.

[21] Appl. No.: 658,394

[22] Filed: Jun. 5, 1996

Related U.S. Application Data

[63] Continuation of Ser. No. 443,218, May 17, 1995, abandoned, which is a continuation of Ser. No. 383,070, Feb. 3, 1995, Pat. No. 5,525,527, which is a continuation of Ser. No. 68,933, May 27, 1993, abandoned, which is a division of Ser. No. 839,268, Feb. 20, 1992, Pat. No. 5,254,480.

[51] Int. Cl.⁶ .......................... H01L 27/146; H01L 31/00; G01T 1/24
[52] U.S. Cl. ............................. 250/370.09; 250/370.08; 250/208.1
[58] Field of Search ................. 250/370.09, 370.14, 250/580, 370.01, 370.08, 208.1

[56] References Cited

U.S. PATENT DOCUMENTS

| | | | |
|---|---|---|---|
| 3,825,763 | 7/1974 | Ligtenberg et al. | 250/486.1 |
| 4,069,355 | 1/1978 | Lubowski et al. | 427/70 |
| 4,129,848 | 12/1978 | Frank et al. | 338/308 |
| 4,226,898 | 10/1980 | Ovshinsky et al. | 427/39 |
| 4,467,342 | 8/1984 | Tower | 357/30 |

(List continued on next page.)

FOREIGN PATENT DOCUMENTS

| | | |
|---|---|---|
| 0 175 578 | 3/1986 | European Pat. Off. . |
| 0 338 766 | 10/1989 | European Pat. Off. . |
| 0 377 365 | 7/1990 | European Pat. Off. . |
| 0 419 160 | 3/1991 | European Pat. Off. . |
| 0 441 521 | 8/1991 | European Pat. Off. . |
| 0 449585 | 10/1991 | European Pat. Off. . |
| 60-16462 | 1/1985 | Japan . |
| 62-51264 | 3/1987 | Japan . |
| 63-261880 | 10/1988 | Japan . |
| 64-61062 | 3/1989 | Japan . |
| 2-82578 | 3/1990 | Japan . |
| 63-210231 | 5/1990 | Japan . |
| 3097271 | 4/1991 | Japan . |
| 2 211 992 | 7/1989 | United Kingdom . |
| WO 92/02959 | 2/1992 | WIPO . |

OTHER PUBLICATIONS

Chikamura, T., et al., "The Characteristics of Amorphous Silicon TFT and Its Application in Liquid Crystal Display", *Materials Research Society Symposium Proceedings*, vol. 95, 1987, pp. 421–430.

Burke, Barry E. et al., "420X420 Charge–Coupled–Device Imager and Four–Chip Hybrid Focal Plane", *Optical Engineering*, vol. 26, No. 9, Sep. 1987, pp. 890–896.

Zhao, W., et al., "A Large Area Solid–State Detector for Radiology Using Amorphous Selenium", *Medical Imaging VI: Instrumentation, Proceedings of The Society of Photo–Optical Instrumentation Engineers*, vol. 1651, Feb. 23–24, 1992, pp. 134–143.

(List continued on next page.)

*Primary Examiner*—Edward J. Glick
*Attorney, Agent, or Firm*—William K. Weimer

[57] ABSTRACT

A solid state radiation detector and fabrication method therefor provide a plurality of modules disposed adjacent one another in a two-dimensional array. Each of the modules includes an array of thin film transistors. A continuous radiation detecting layer, such as a photoconductor layer is disposed over the modules. The radiation detecting layer generates electrical charge representative of a pattern of radiation. The thin film transistors are used to sense the electrical charge on a pixel-by-pixel basis to form a representation of an image. A continuous insulating layer can be disposed between the radiation detecting layer and a continuous conducting layer.

11 Claims, 8 Drawing Sheets

U.S. PATENT DOCUMENTS

| | | | |
|---|---|---|---|
| 4,511,799 | 4/1985 | Bjorkholm | 250/367 |
| 4,543,490 | 9/1985 | Gupta | 250/578 |
| 4,608,749 | 9/1986 | Harada et al. | 29/572 |
| 4,672,454 | 6/1987 | Cannella et al. | 358/213.11 |
| 4,675,739 | 6/1987 | Catchpole et al. | 358/213.11 |
| 4,689,487 | 8/1987 | Nishiki et al. | 250/361 R |
| 4,735,908 | 4/1988 | Higashi et al. | 437/2 |
| 4,769,338 | 9/1988 | Ovshinsky et al. | 437/39 |
| 4,778,773 | 10/1988 | Sukegawa | 437/41 |
| 4,788,582 | 11/1988 | Yamamoto et al. | 357/71 |
| 4,799,094 | 1/1989 | Rougeot | 357/30 |
| 4,810,881 | 3/1989 | Berger et al. | 250/370.01 |
| 4,859,617 | 8/1989 | Nomoto et al. | 437/40 |
| 4,866,003 | 9/1989 | Yokoi et al. | 437/40 |
| 4,883,766 | 11/1989 | Ishida et al. | 437/40 |
| 4,929,569 | 5/1990 | Yaniv et al. | 437/51 |
| 4,940,901 | 7/1990 | Henry et al. | 250/370.09 |
| 4,943,837 | 7/1990 | Konishi et al. | 357/23.7 |
| 4,954,706 | 9/1990 | Takahashi et al. | 250/327.2 |
| 4,980,553 | 12/1990 | Henry | 250/369 |
| 4,982,095 | 1/1991 | Takahashi et al. | 250/367 |
| 4,999,484 | 3/1991 | Kaneko | 250/208.1 |
| 5,043,582 | 8/1991 | Cox et al. | 250/370.09 |
| 5,079,426 | 1/1992 | Antonuk et al. | 250/370.09 |
| 5,132,541 | 7/1992 | Conrads et al. | 250/370.01 |
| 5,182,624 | 1/1993 | Tran et al. | 257/40 |
| 5,187,369 | 2/1993 | Kingsley et al. | 250/370.11 |
| 5,220,170 | 6/1993 | Cox et al. | 250/370.09 |
| 5,254,480 | 10/1993 | Tran | 250/370.09 |
| 5,286,659 | 2/1994 | Mitani et al. | 437/21 |
| 5,315,101 | 5/1994 | Hughes et al. | 250/208.1 |
| 5,319,206 | 6/1994 | Lee et al. | 250/370.09 |
| 5,381,014 | 1/1995 | Jeromin et al. | 250/370.09 |

OTHER PUBLICATIONS

Curry, III, T.S., et al., "Production of X Rays", *Christensen's Physics of Diagnostic Radiology,* Lea & Febiger, 4th Edition, pp. 26–27, 1990.

Weste, Neil and Eshraghian, Kamran, "Principles of CMOS VLSI Design", *Addison–Wesley Publishing Co.,* p. 156, 1985.

Weimer, P.K., et al., "Multielement Self–Scanned Mosaic Sensors", *IEEE Spectrum,* pp. 52–65, Mar. 1969.

Two Mask Step Polysilicon TFT Technology for Flat Panel Displays, *Electronic Letters,* vol. 24, No. 3, pp. 156–157, Feb. 4, 1988.

Beerlage, M.J.M., et al., "Digital Slot Radiography Based on a Linear X–ray Image Intensifier and Two–Dimensional Image Sensors", *SPIE,* vol. 626 Medicine XIV/PACS IV, pp. 161–169, 1986.

MULTI-MODULE SOLID STATE RADIATION DETECTOR WITH CONTINUOUS PHOTOCONDUCTOR LAYER AND FABRICATION METHOD

This is a continuation of application Ser. No. 08/443,218, filed May 17, 1995, now abandoned, which is a continuation of application Ser. No. 08/383,070, filed Feb. 3, 1995, now U.S. Pat. No. 5,525,527, which is a continuation of application Ser. No. 08/068,933, filed May 27, 1993, now abandoned, which is a divisional of application Ser. No. 07/839,268, filed Feb. 20, 1992, now U.S. Pat. No. 5,254,480.

BACKGROUND OF THE INVENTION

The present invention relates to x-ray sensing detectors, in particular, it relates to a process for fabrication of such detectors.

Efforts have been made to replace x-ray film in radiology through the use of x-ray intensifiers, video cameras, displays, and non-film detectors. One such system employs a scintillation crystal to convert x-rays to corresponding visible light radiation, "Digital Slot Radiography Based on a Linear X-Ray Image Intensifier and Two-Dimensional Image Sensors," Beerlage, Levels, and Mulder, SPIE Vol. 626 Medicine, XIV/PACS IV 161–169 (1986). A photodetector is then used to generate an electrical signal corresponding to the intensity of the visible light radiation. The electrical signal from the detector is converted to digital data and stored in a memory device or electrically displayed, such as on a cathode array tube.

Solid state detectors have also been used in x-ray astronomy. One such detector system was reported in "Multi-Element Self-Scanned Mosaic Sensors," Weimer et al, IEEE Spectrum, March 1969, pages 52–65. The system included an array consisting of a matrix of photodiodes which are charged by light to produce electron-hole pairs.

The Catchpole et al U.S. Pat. No. 4,675,739 describes an incident radiation solid state sensing array made of photosensing elements. Each photosensing element includes back-two-back-diodes, one a photo responsive diode and the other a blocking diode. Each of the diodes has an associated capacitance formed by its electrodes. The magnitude of the charge remaining on a given capacitor is sensed and relates back to the intensity of the incident radiation impinging upon the photosensitive diode. Furthermore, in such a linear photodiode array, the scanning time is so long that real time read-out is made impractical. In addition, the linear photodiode array has to be moved to obtain a two-dimensional image.

Another solid state sensing array includes charge-coupled devices. Charge-coupled devices have a layer of relatively conductive semi-conductor material separated from a layer containing electrodes by an insulator in a two-dimensional image sensing array. However, charge-coupled devices can presently be produced at a format of only less than one inch by one inch. Larger formats of arrays have charge transfer problems due to the number of defective devices that can exist in one line of the array. A defective device in one line of the array can result in a charge not being transferred through that line in the array.

The Nishiki et al U.S. Pat. No. 4,689,487 describes the use of a large area solid state detector (40 cm×40 cm). This solid state detector includes pixels in 2,000×2,000 matrix form. Each pixel consists of a photodiode conductively connected in parallel to a capacitor which are both then conductively connected to the drain of a metal oxide semi-conductor field effect transistor (MOSFET). The photodiodes are of a polycrystalline or amorphous silicon material.

The Berger et al U.S. Pat. No. 4,810,881 describes an amorphous silicon detector of 36 cm×43 cm. Each pixel in the detector includes an amorphous silicon diode that is conductively connected in series to a capacitor which in turn are both then conductively connected to the drain of an amorphous silicon-based junction field effect transistor.

In any fabrication process of making large area solid state detectors, the number of microlithography masking steps plays a critical role in determining the yield of usable detector devices, and hence the commercial viability of such devices. Solid state detector devices that include photodiodes and thin-film transistors (TFTs) require a high number of microlithography masking steps. For example, 16 masking steps may be required to produce a DRAM (Dynamic Random Access Memory) device and nine to ten steps to produce a liquid crystal display device. The yield Y for such devices is proportional to $Y^n$, where Y is the yield for each individual masking step, and n is the number of masking steps. The yield may also be defined by $Y=e^{-\sqrt{AD}}$ where A is the chip area and D is the defect density defined as defects per square centimeter. A high number of microlithography steps will cause more defects and large area will create a lowering in yield. Principles of CMOS VLSI Design, Neil Weste, and Kamran Eshraghian, Addison-Wesley Publishing Co., pg. 156. It will be appreciated that the alignment during masking must be exact due to the small area of each pixel, for example, 85 $\mu$m×85 $\mu$m. Misalignment of the masks can occur easily and result in a short in the device.

SUMMARY OF THE INVENTION

The present invention includes a process for producing an array of thin film solid state detectors. The process includes depositing on a substrate one or more layers of a silicon-based substance. A metal layer is then deposited overlying the silicon-based substance layers. An array of metal layer regions is formed in the metal layer by removing selected areas of the metal layer thereby exposing selected layers of the silicon-based substance. Then using the metal layer regions as a mask, selected areas of the silicon-based substance layers are removed to form the array of sensing devices thereby automatically aligning the silicon-based substance layers with the metal layer.

DETAILED DESCRIPTION OF THE PREFERRED EMBODIMENTS

The present invention includes a process for producing an array of thin-film radiation detectors using a greatly reduced number of microlithography steps. In the process of the present invention, one or more layers of a silicon-based substance are deposited on the substrate. By silicon-based substance is meant amorphous silicon, polysilicon, single crystal silicon, or silicon alloys. Silicon alloys include alloys such as silicon nitride, silicon oxide, silicon carbide, and the like. A metal layer is then deposited adjacent the layers of silicon-based substance. Selected areas in the metal layer are then removed exposing selected areas of the silicon-based substance layers. Using the metal layer as a mask, the selected areas of the silicon-based substance layers are removed to form the array of sensing devices of the present invention.

Figure 1:
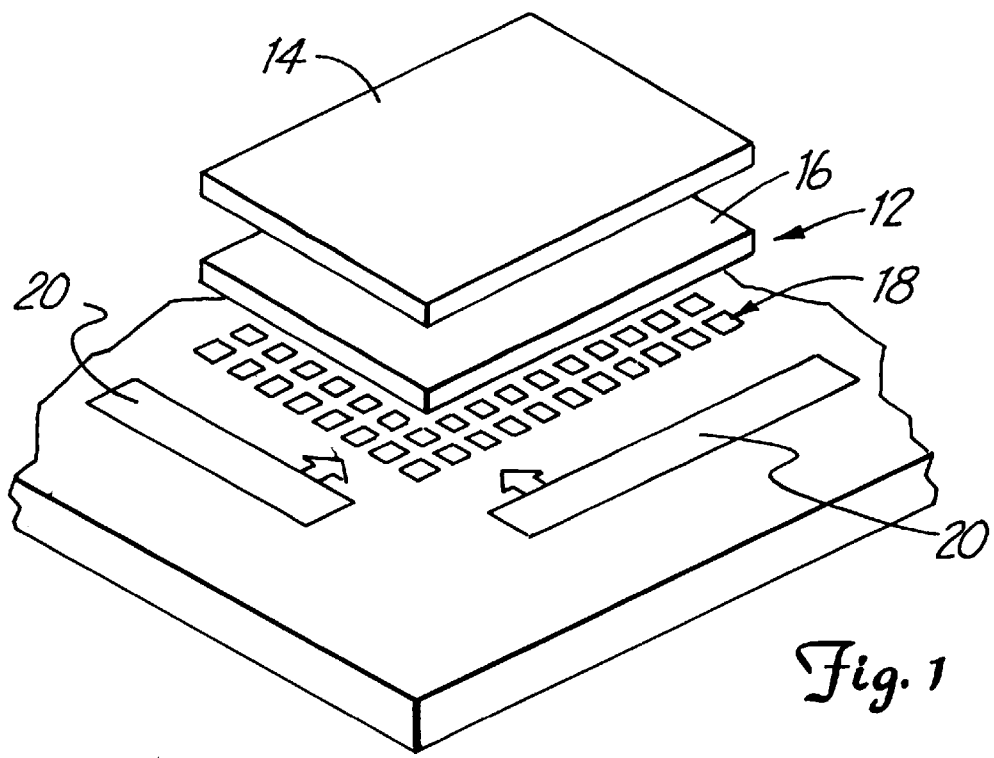
FIG. 1 is an exploded perspective view of an x-ray detector of the present invention.

The process is particularly useful in forming an x-ray sensing detector 12 as illustrated in FIG. 1 having a large detection area such as 14 inches by 17 inches. The detector 12 includes a luminescent layer 14, an array layer 16 of either amorphous silicon Schottky barrier diode, amorphous silicon p-i-n diode, or amorphous silicon photoconductors, or direct x-ray sensors having amorphous selenium wherein luminescent layer 14 is not required, and a polysilicon or single crystal silicon thin-film transistor (TFT) array layer 18. The detector further includes real-time read-out circuitry 20. The luminescent layer 14 converts incident x-rays to corresponding visible light radiation. The array 16 generates an electrical signal corresponding to the intensity of light from the luminescent layer 14. Current generated in the array 16 is fed to the electrodes of associated TFTs in the array 18.

The pixels forming such an array are typically 85 $\mu$m×85 $\mu$m in area. Alignment of the various layers in the TFTs and the array 16, and alignment of the array 16 with respect to the TFTs is essential for a commercially viable device that produces an image with satisfactory resolution. The greater the amount of defective pixels in such a device, the poorer the resolution of the image. In addition, alignment of the layers in each pixel results in an active area in each pixel that is greater than the active areas in pixels produced under prior art methods. The sequence of microlithographic steps that were used in prior art methods resulted in each subsequently formed layer being smaller in area than the layer below in order to minimize alignment problems. Since the process of the present invention automatically aligns the layers as discussed above, the resulting active area of each pixel is greater.

Figure 2:
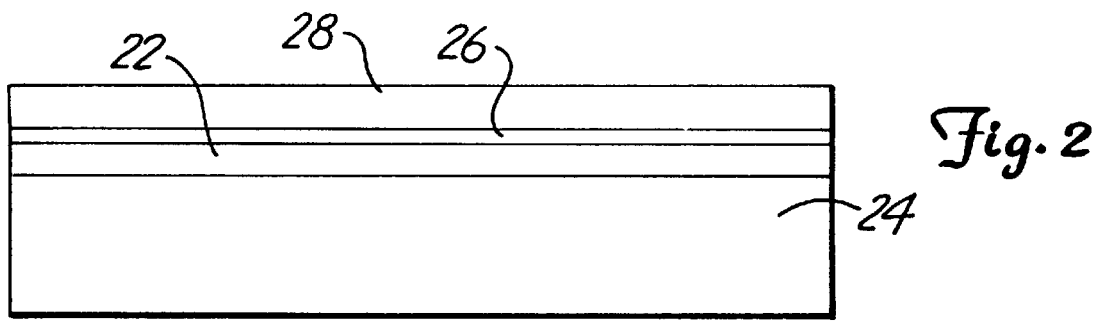
FIGS. 2 through 13 are sectional views of the process of the present invention forming one pixel unit of the detector array of the present invention.
Figure 3:
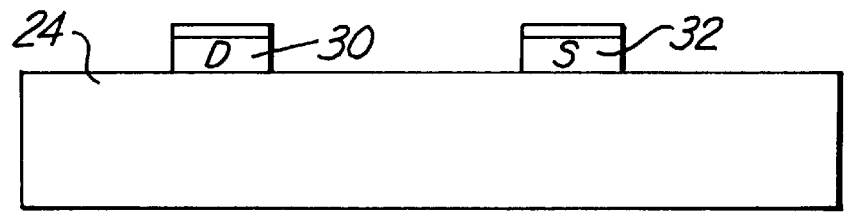

An example of the process of the present invention that produces the sensing device of FIG. 1 is illustrated in FIGS. 2 through 13. First, a metal such as chromium is deposited as layer 22 on a coated silicon wafer substrate 24 as illustrated in FIG. 2. Other substrates, such as glass, $SiO_2$, or quartz, may also be used. The chromium is deposited in a layer approximately 1,000 Å to 3,000 Å thick by sputtering. Other metals such as tantalum or molybdenum in thicknesses ranging from 1,000 Å to 3,000 Å are also suitable. Other metals may be deposited by using E-beam evaporation or thermal resistance evaporation. On top of the metal layer 22 is deposited a layer 26 of n-type doped amorphous silicon ($n^+$-a-Si:H). at a thickness of 500 Å. The $n^+$-a-Si:H is deposited preferably using plasma-enhanced chemical vapor deposition (PECVD). However, other techniques such as low pressure chemical vapor deposition (LPCVD), electron cyclotron resonance chemical vapor deposition (ECRCVD), or sputtering a silicon target in hydrogen and argon atmosphere may also be used. A photoresist layer 28 is then spin coated on the $n^+$-a-Si:H layer, and a conventional microlithographic procedure is then used to form the drain region 30 and source region 32 on the substrate 24 as illustrated in FIG. 3. This microlithographic step is also used to form the source and drain lines and contact pads (not shown).

Figure 4:
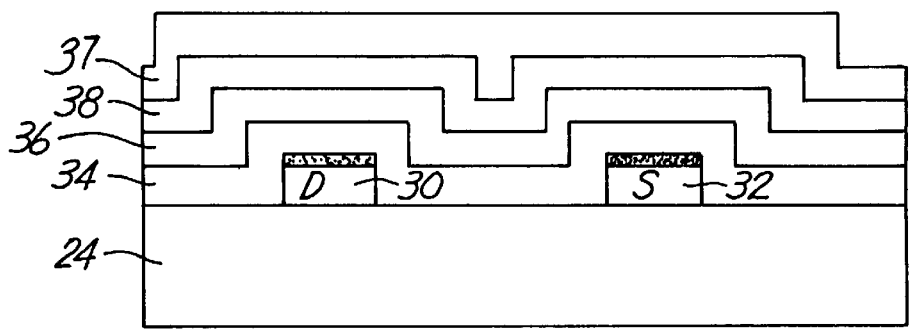

On the formed drain and source regions 30 and 32, an undoped amorphous silicon layer 34 (a-Si:H) of 1,000 Å to 5,000 Å in thickness using PECVD is then deposited as illustrated in FIG. 4. On top of the undoped amorphous silicon layer 34, a dielectric layer 36 of $SiN_x$ of 2,000 Å is deposited. The deposition of $SiN_x$ is done through the use of PECVD. The dielectric layer 36 can also be $SiO_x$ or $SiN_x/SiO_x$ or $Ta_2O_5$ and can be formed by either LPCVD, ECRCVD or sputtering. On the dielectric layer, a layer 38 of platinum 1,000 Å in thickness is deposited using conventional sputtering techniques. Other metals such as tantalum, molybdenum or tungsten ranging from 1,000 Å to 3,000Å in thickness may also be used. The stacked layers 34, 36, and 38 are then annealed using furnace annealing techniques in a nitrogen atmosphere at 600° C. for 15 hours to crystalize the silicon layers and to enhance the dielectric properties of the layer 36. The annealing may also be done using rapid thermal annealing techniques at 600° to 700° C. in an inert atmosphere such as argon or nitrogen for three to 15 minutes. Optionally E-beam annealing or laser annealing can also be used.

Figure 5:
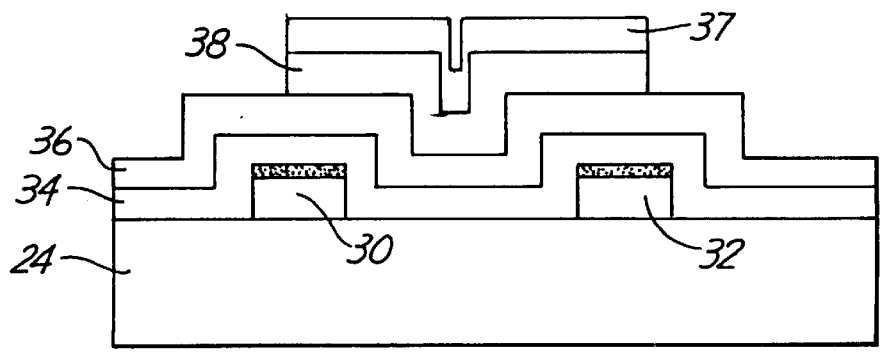
Figure 6:
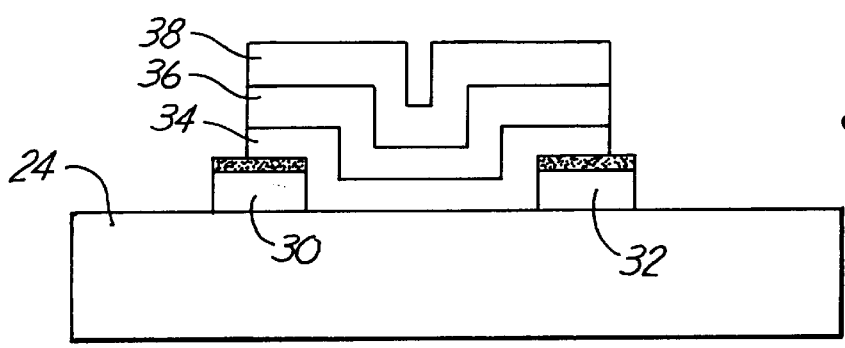

A photoresist layer 37 is then spin coated on the platinum layer 38 and conventional microlithographic techniques to form a pattern in the platinum layer 38 to remove selective areas of the layer 38. The selected areas are preferably removed by sputter-etch in an argon atmosphere. The remaining areas of the layers 38 and 37 serve as a mask, as best illustrated in FIG. 5, for the removal of selected areas of the dielectric layer 36 and the amorphous silicon layer 34. After removal of the selected areas of layers 34 and 36, the photoresist layer 37 overlying the layer 38 is removed. As can readily be appreciated, the layers 34, 36, and 38 are automatically aligned due to the use of layer 38 as a mask as illustrated in FIG. 6.

Figure 7:
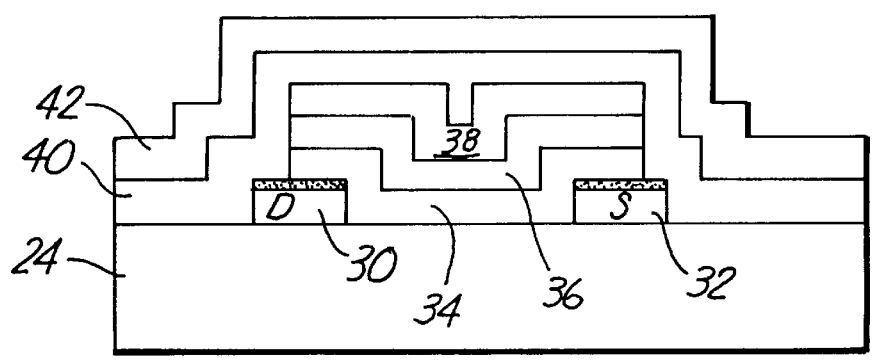

Prior to formation of the photodiode, the layers 34, 36, 38, and the drain region and source region are insulated by the deposition of an insulating layer 40, as illustrated in FIG. 7. The insulating layer 40 is preferably a triple layer containing a first layer 2,000 Å in thickness of $SiN_x$, a second layer 2,000 Å in thickness of $SiO_x$, and a third layer 2,000 Å in thickness of $SiN_x$. The thickness of the insulating layer may range from 4,000 Å to 8,000 Å.

Figure 8:
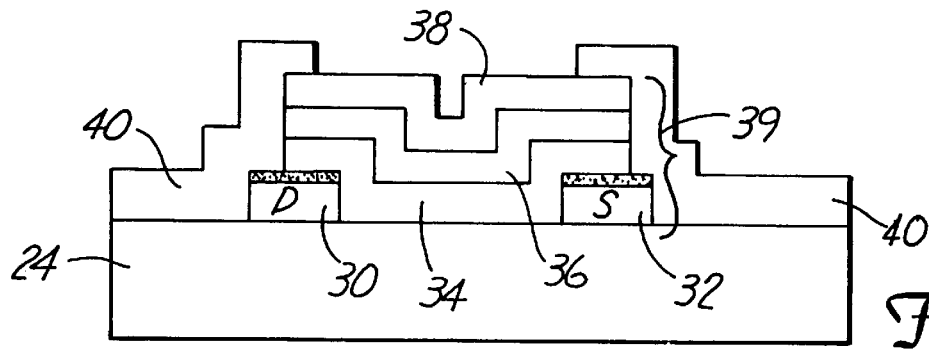
Figure 9:
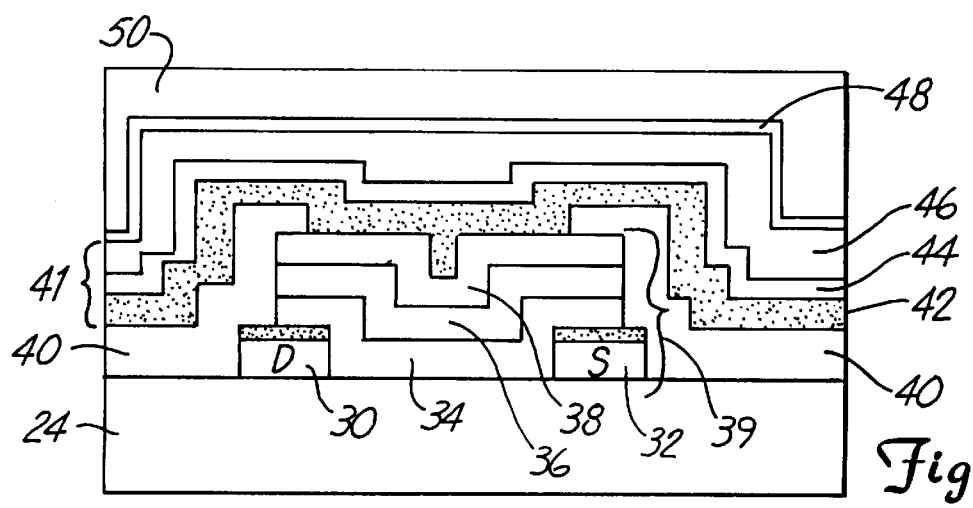

A photoresist layer 42 is then deposited on the insulating layer 40 and a microlithographic masking step is then used to open a via hole over each TFT which will subsequently be used to conductively connect the TFTs with the photodiodes in the array, as illustrated in FIG. 8. Next, the photodiode 41 is formed over the TFT 39, as illustrated in FIG. 9. A chromium layer 42 of 1,000 Å thickness is deposited by sputtering. An n-type doped amorphous silicon layer 44 (a-Si:H) of 500 Å thickness is then deposited using PECVD. Next, an undoped amorphous silicon (a-Si:H) layer 46 of 4,000 Å to 5,000 Å thickness is deposited on the layer 44. Lastly, a platinum layer 48 of 150 Å thickness is deposited preferably using known sputter-etch technique on top of the layer 46 to complete the layers forming the photodiode 41.

Figure 10:
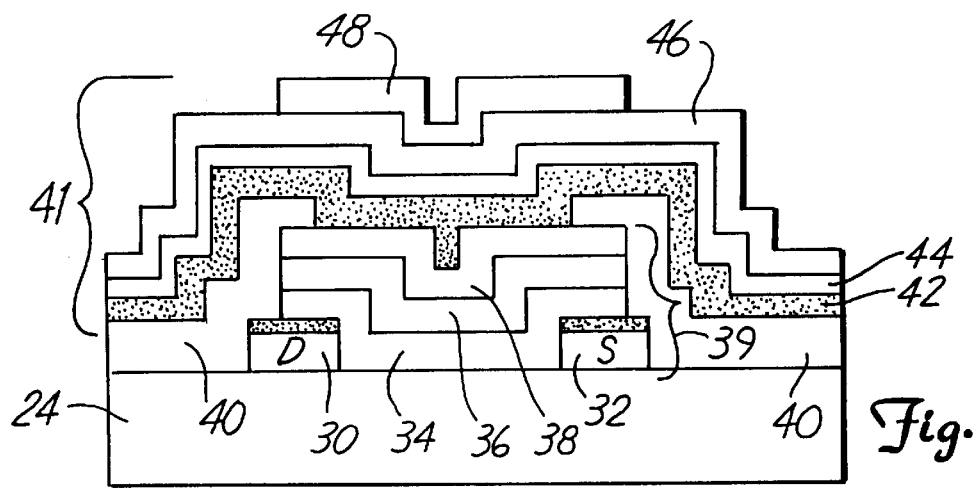
Figure 11:
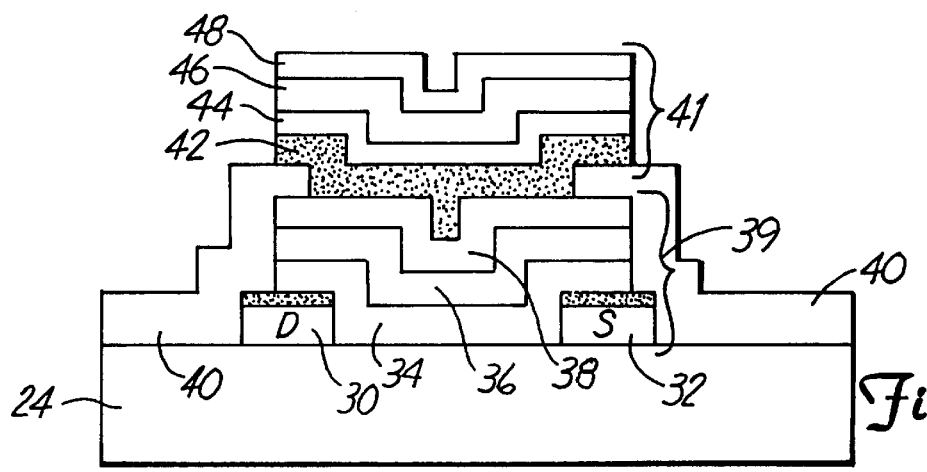

A photoresist layer 50 is then spin coated on the platinum layer and microlithography is used to pattern the platinum layer, removing selected areas with the remaining areas overlying the TFT 39, as best illustrated in FIG. 10. The remaining platinum areas of the layer 48 are then used as a mask to remove selected areas of layers 42, 44, 46 to form the photodiode 41, as illustrated in FIG. 11. Using the remaining areas of the platinum layer 48 as a mask, automatically aligns remaining areas of layer 42, 44, 46 beneath the platinum layer with the platinum layer. As discussed previously, prior art techniques required the use of multiple microlithographic steps between the depositions of each layer. Using multiple microlithographic steps required exact alignment of the masking of each layer. Even with exact alignment attempts, defects, such as the top platinum layer 48 and the bottom electrode layer 42 being slightly misaligned can occur causing shorts in the device.

Although sputter-etching of the platinum layer 48 is preferred, other techniques such as wet etch using aqua regia or lift-off techniques may also be used. The n+-type a-Si:H layer 44 and the undoped a-si:H layer 46 are etched using preferably reactive ion etching (RIE). Wet etch techniques can also be used. Aqua regia etching is not as preferred as sputter-etching, since aqua regia etching suffers from the disadvantage of attacking other layers and just as quickly or even faster than the platinum. Lift-off techniques give imprecise etch definition and surface contamination, which results in a device that is somewhat inferior to the one that is made by sputter-etching. In the use of sputter-etching, the photoresist layer should be left on the platinum until the underlying layers have been etched to form the device. The photoresist helps protect the platinum layer 48 during the etching of the underlying layers 44 and 46. The layers 44 and 46 may be removed by wet or dry etching while the chromium layer 42 is removed by wet etching.

Platinum is preferred as the top layer for the photodiode. In addition, although other metals have been mentioned for use in the gate, source, and drain regions of the TFT, platinum can also be used. Platinum is preferred since it is an inert material and is not easily attacked by etching chemicals, which makes platinum a preferred metal for use as a mask in the process of the present invention. In addition, platinum has a very high Z (Z=78), which aids in protecting the layers underneath the platinum layer from x-ray radiation. X-ray absorption is a function of $Z^5$. Metals having Z of at least 73, and preferably 74 or better, aid in x-ray absorption.

After the photodiode has been formed, annealing may be done in a hydrogen atmosphere at 0.5 to 2 Torr at approximately 300° C. for one to three hours to reduce the defect densities at the platinum/a-Si:H interface. Platinum layers as thick as 300 Å have been used successfully.

Alternatively, a p-i-n diode may also be formed over the TFT 39 using the techniques described above instead of a Schottky barrier diode. Initially, a layer of chromium approximately 1,000 Å is deposited over the TFT. Next, an n-type doped amorphous silicon layer approximately 100 Å to 500 Å is deposited on the chromium, with an undoped amorphous silicon layer approximately 4,000 Å to 5,000 Å deposited on the n-type doped amorphous silicon layer. Next, a p-type doped amorphous silicon layer is deposited on the undoped amorphous silicon layer of 100 Å to 500 Å in thickness. Alternatively, the p-type doped amorphous silicon can be amorphous silicon carbide (a-SiC:H). An Indium Tin Oxide (ITO) layer of 1,000 Å to 2,000 Å is then deposited on the p-type layer. The order of the p and n layers, of course, can be reversed. The ITO layer is patterned in a similar manner as the platinum layer 48 discussed with respect to the diode 41. After the ITO layer has been patterned and selected areas removed, the ITO layer is then used as a mask to wet or dry-etch the p-i-n or n-i-p layers with the chromium layer being wet-etched last. Other materials such as amorphous silicon-based alloys, single crystal silicon, copper indium diselenide, and other materials known in the art for photodiodes may also be used.

Figure 12:
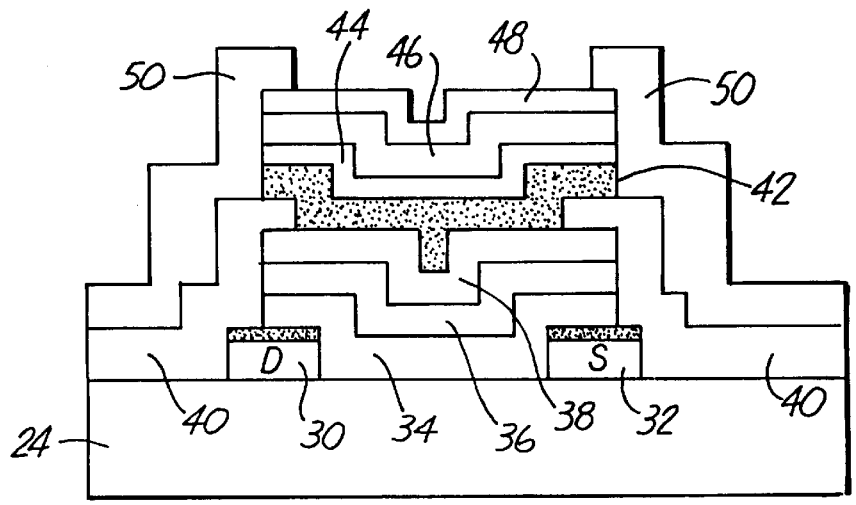

Whether a Schottky barrier diode has been formed or a p-i-n or an n-i-p diode, a top insulating layer 50 is deposited on the diode as illustrated in FIG. 12. The insulating layer 50 similar to the insulating layer 42, discussed previously, preferably includes a first $SiN_x$ layer approximately 2,000 Å, a second $SiO_x$ layer of 2,000 Å thickness, and a third $SiN_x$ layer of 2,000 Å thickness. The layer 50 acts as an isolation layer. Microlithography is used to expose the platinum layer 48.

Figure 13:
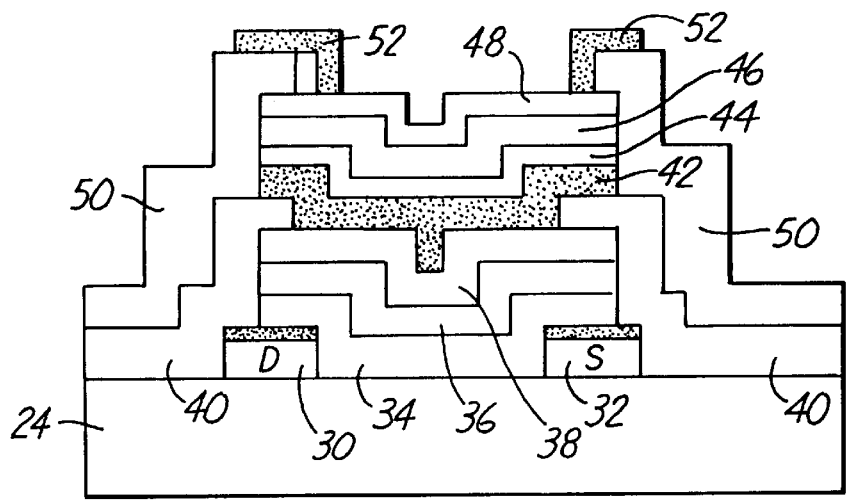
Figure 14:
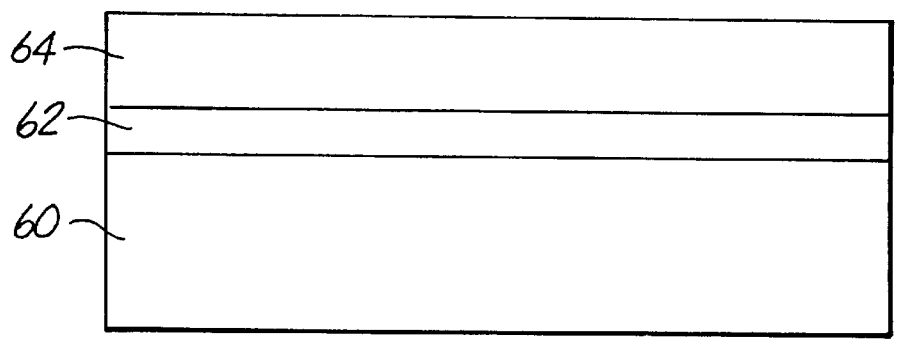
FIGS. 14 through 23 are sectional views of another embodiment of a pixel unit of an array formed by the process of the present invention.

Next, an aluminum layer 52 doped with one percent silicon of approximately 3,000 Å to 1 μm in thickness is deposited on the insulating layer 50 and the platinum layer 48 as illustrated in FIG. 13. The layer 52 is then masked using microlithography to define a conductive line.

X-ray sensitive phosphor for use in the detector of the present invention may be chosen from those well-known in the radiographic art for use in intensifying screens. Such phosphors include gadolinium oxysulfide doped with terbium or europium, yttrium oxide, calcium tungsten, barium, fluorochloride doped with europium, barium sulfate or strontium sulfate doped with terbium or thulium or dysprosium, and zinc sulfide or with cesium iodine doped with thallium. The phosphor may be situated individually over each pixel in microcolumns. The individual microcolumn arrangement confines the scattered emitted light to the area of the associated pixel. Although conventional screens can also be used with the present invention, the use of such a screen results in some spreading of the emitted light which causes a reduction in the image sharpness.

The use of columnar phosphor results in greater image sharpness since the emitted light is confined to the column area. In addition, since the scattered emitted light is confined, the thickness of the phosphor layer can be increased without loss in image sharpness. Increasing the thickness of the phosphor provides greater absorption of incident x-rays thereby improving the sensitivity of the detector.

Techniques for producing columnar phosphor are known in the art. European patent application Publication 0 175 578 describes the use of columnar phosphor layers selected from barium sulfate doped with terbium or thulium or dysprosium, strontium sulfate doped with terbium or thulium or dysprosium and alkylhalides. Such phosphor layers may be formed by vacuum evaporation, sputtering, or other vacuum deposition techniques known in the art. Columnar phosphor screens including oxysulfides of gadolinium or lanthanum are described in U.S. Pat. No. 4,069,355. Such structured phosphors are made by vapor deposition techniques. Columnar structured phosphors can also be formed by evaporating cesium iodine doped with thallium on the detector.

A metal-oxide-semiconductor field effect transistor (MOSFET) may be substituted for the thin film transistor to produce the device of the present invention. To produce the MOSFET using the process of the present invention, the substrate (which is silicon wafer coated with 1–3 μm of thermal oxide for insulating) is coated with an silicon layer of 1,000 Å to 15,000 Å in thickness using LPCVD or PECVD. Silicon, either in an amorphous state or in a crystalline state is then annealed using furnace annealing, rapid thermal annealing, E-beam annealing, or laser annealing to form large grain size polycrystalline or single crystal silicon. The crystallized silicon layer is then patterned into islands using microlithography. A 1,000 Å thickness silicon oxide layer for the gate is grown on the patterned crystallized silicon layer. A polysilicon layer of about 1,000 Å to 3,500 Å thick is then deposited by LPCVD. The gate oxide and the polysilicon layer are then etched by microlithography. Ion implantation with phosphorous to a level of $10^{15}$ atoms/cm$^2$ is done to obtain n-type characteristics. After implantation, the phosphorous is activated by annealing between 800° C. to 1,050° C. for 20 minutes. A thin layer of 200 Å–500 Å of silicon oxide was formed on the polysilicon layer due to the activated annealing process. Using microlithography, via holes for drain and source contact are formed in the silicon oxide. Aluminum doped with one percent silicon is deposited by sputtering to form the drain and source during the same microlithography step using a lift-off technique. Using the process of the present invention, only three microlithography steps are used to form the MOSFET.

The electrical connection between the photosensitive diode and the TFT may be done using any one of three alternatives. The bottom contact of the photosensing diode is connected to the TFT gate, or the bottom contact of the photosensing diode is connected to the drain electrode of the TFT, or the top contact of the photosensing diode is connected to the source electrode of the TFT.

Figure 15:
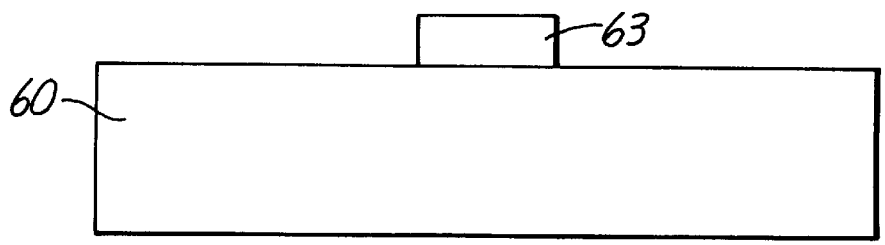

The process of the present invention may also be used to form an array radiation detector in which the position of the gate of the TFT is initially deposited on the substrate, as illustrated in FIGS. 14 through 23. Initially, a metal layer 62 of chromium or tantalum of 1,000 Å to 3,000 Å in thickness is deposited on a glass substrate 60. Prior to deposition, the glass substrate can be coated with a layer of SiO$_2$ to prevent contamination of the metal layer such as from sodium leaching from the glass: substrate. Layer 62 can be deposited by sputtering, E-beam evaporation, or thermal resistance evaporation. A type photoresist layer is then deposited on the metal layer 62. As illustrated in FIG. 15, microlithography is then used to form a gate area 63 from the layer 62.

Figure 16:
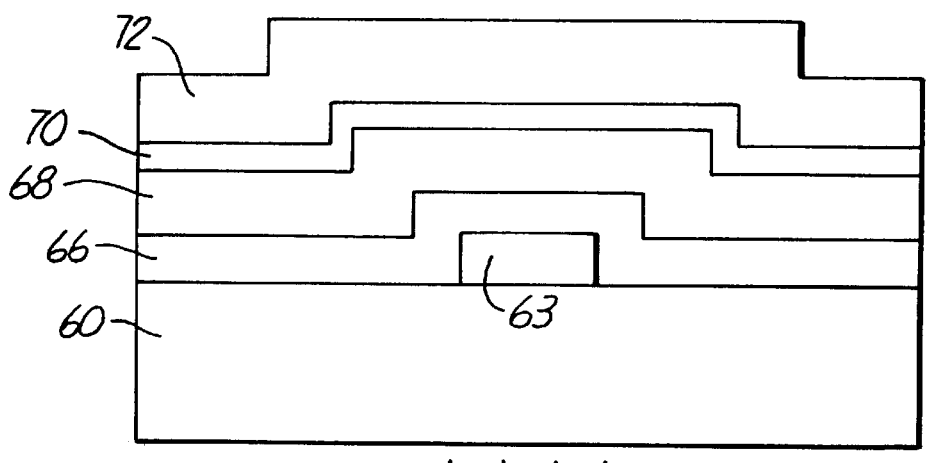
Figure 17:
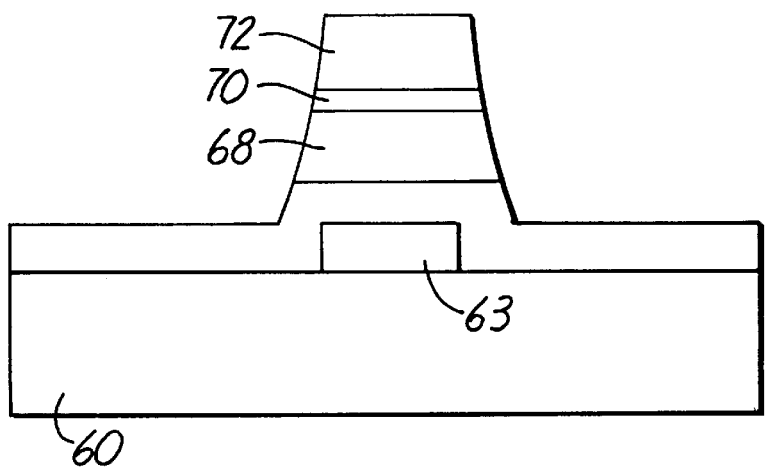

As next illustrated in FIG. 16, a dielectric layer 66 of SiN$_x$ of 1,000 Å to 3,000 Å in thickness through the use of PECVD is deposited over the substrate 60 and the gate area 63. On top of the dielectric layer 66 is deposited an a-Si:H undoped layer 68 of 5,000 Å thickness and a phosphorous doped a-Si:H layer 70 500 Å in thickness is deposited on the layer 68, both layers 68 and 70 being deposited by PECVD. A negative photoresist layer 72 is then spin coated on the layer 70. Using the gate electrode area 63 as a mask, UV light, as depicted by arrows 75, is used to inhibit the development of the areas not covered by the gate 63 permitting the area of the photoresist behind gate 63 to develop. The underlying layers 70 and 68 are etched as illustrated in FIG. 17 aligning the layers with the gate area 63. The remainder of the photoresist layer 72 is then removed.

Figure 18:
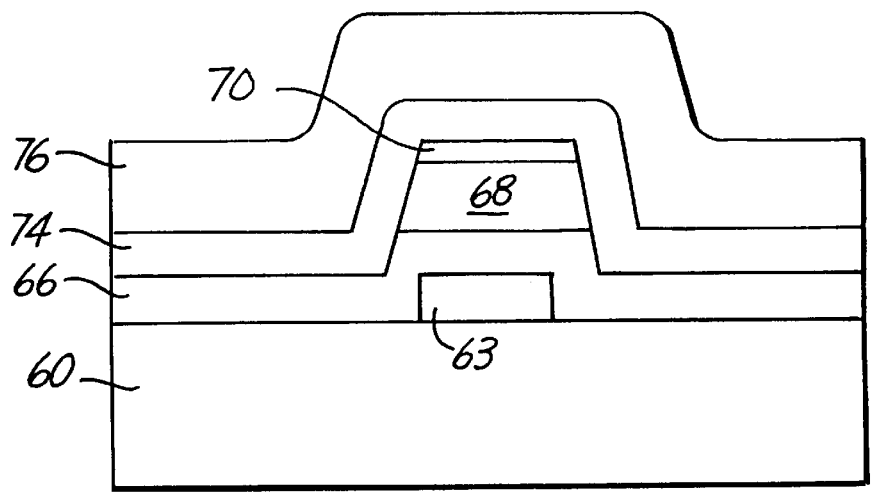
Figure 19:
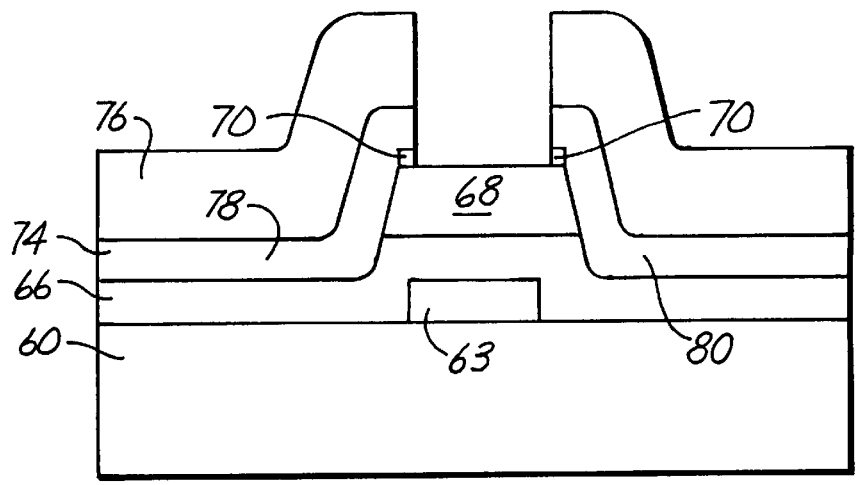
Figure 20:
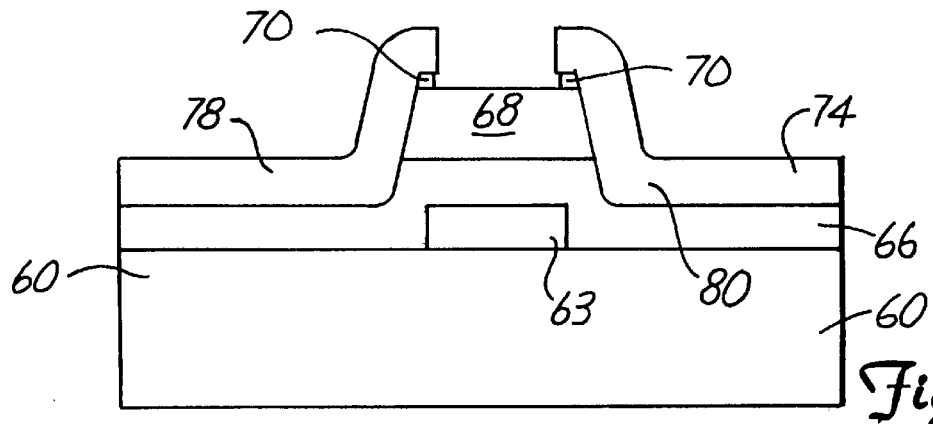

Next, a metal layer 74 of aluminum doped with one percent silicon of 1,000 Å to 3,000 Å is deposited by sputtering, and a photoresist layer 76 is spin coated on the layer 74, as illustrated in FIG. 18. A second microlithography step is used to expose the a-Si:H layer 68 by etching through the metal layer 74 and the doped a-Si:H layer 70 to form a source region 78, a drain region 80 and respective contact lines (not shown).

Figure 21:
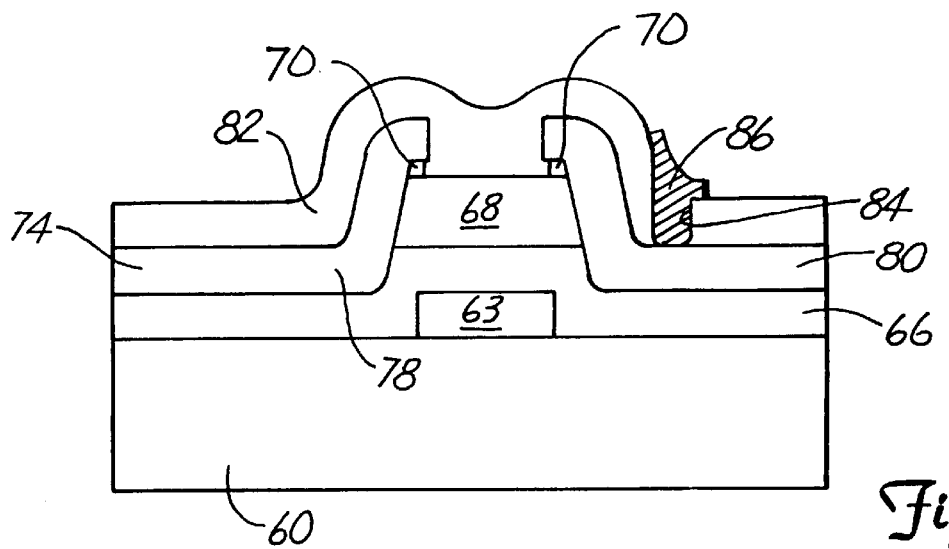

Next, after the photoresist layer 76 has been removed, the devices forming the array are covered with an insulating layer 82 of approximately 6,000 Å of SiN$_x$, as illustrated in FIG. 21. A third microlithographic step is used to form a via hole 84 to the drain region, which is then filled with aluminum doped with one percent silicon 86 and the photoresist (not illustrated) is then removed.

Figure 22:
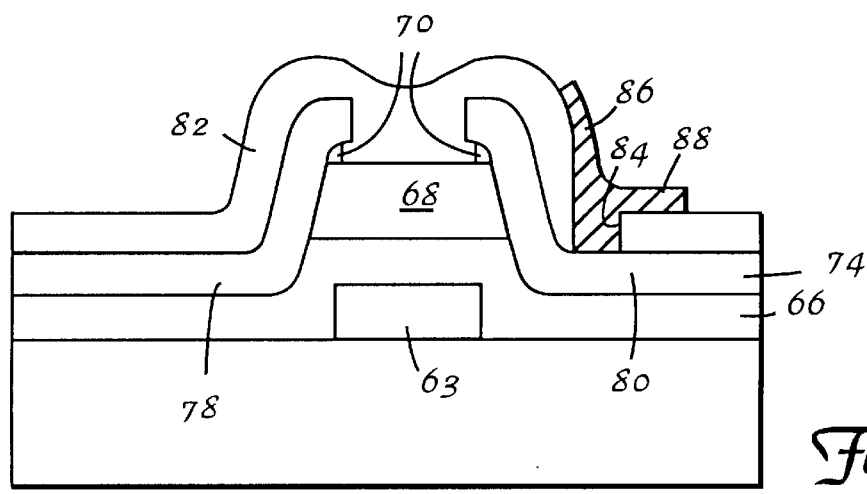
Figure 23:
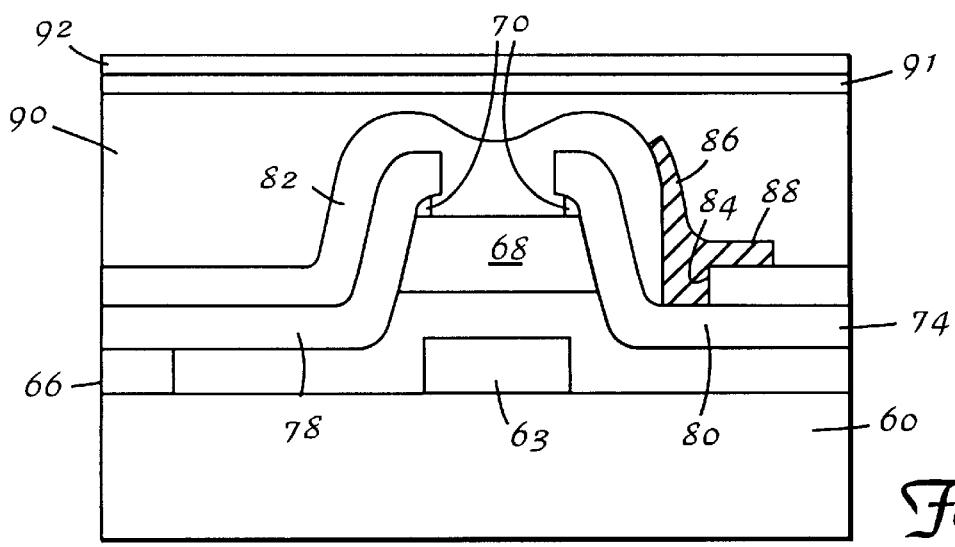

As illustrated in FIG. 22, a bottom electrode 88 is then formed in conductive connection to the aluminum silicon plug 86 by depositing a layer (not illustrated) of metal approximately 1,000 Å to 3,000 Å and a layer of photoresist. A fourth microlithographic step is then used to form the bottom electrode 88 of the to-be-formed photoconductor.

Next, doped and undoped amorphous silicon layers 90 are deposited on the insulating layer 82 and on the bottom electrode layer 88. A top electrode ITO layer 92 of 1,000 Å to 2,000 Å is deposited on the amorphous silicon layers 90 to complete the device.

In the photoconductor/TFT structure of FIGS. 14–23, the photoconductor can include amorphous selenium, lead oxide, selenium-telluride, or other selenium-based alloy. As an alternative structure, an insulating layer 91 can be added on top of the photoconductor layer 90 or in between the photoconductor layer 90 and the TFT without requiring a microlithography step. Although polysilicon is specifically mentioned for use in constructing the TFT, other materials, such as cadmium selenide, can also be used. The present invention is not limited to one TFT/one photodiode arrangement or one TFT/photoconductor arrangement for each pixel. The pixel can be structured with adding one or more photodiodes, one or more TFTs and/or one or more capacitors and/or one or more resistors.

The present invention is useful for making large area detectors. Such large area radiation detectors are formed by assembling several smaller array containing submodules to create a large module such as 14 inches by 17 inches. A process for producing the large area radiation detector may comprise, for example, the steps of forming submodules, each including an array of thin film transistors, positioning in the submodules in side-by-side relationship, forming an electrode layer that overlies the thin film transistor arrays of the submodules, and patterning the electrode layer using microlithography to form an array of electrodes overlying the array of transistors, depositing a continuous layer of photoconductor, and forming a top common electrode layer. In forming the large area modules, the submodules are placed adjacent to each other and are then bonded. However, dead space both physical and electronic is often times created between the submodules. In using the process of the present invention, the dead space between the bottom electrode of the photoconductor or photodiode is virtually eliminated.

Figure 24:
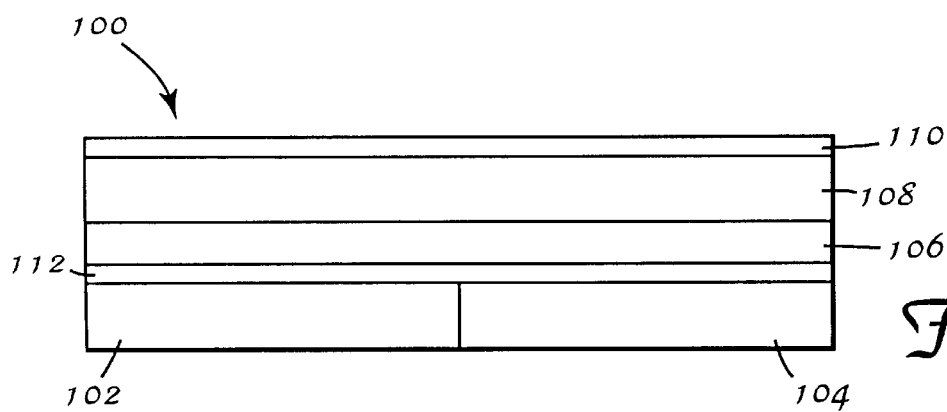
FIGS. 24 is a conceptual side sectional view of a multi-module radiation detector in accordance with the present invention.

First, the thin film transistor is formed on a substrate of each submodule as described previously. The submodules are then positioned in a side-by-side relationship adjacent each other and the bottom electrode of the photoconductor or photodiode is then deposited over the adjacent submodules and then patterned using microlithography to form the individual bottom electrodes of the photodiode or photoconductor. The bottom electrode bonds the submodules together, and provides a common continuous bottom electrode layer for the large area detector. On top of the bottom electrode is deposited the doped and undoped amorphous silicon layers as described previously. The top electrode, preferably a platinum layer, is then deposited, and one microlithographic step as described previously is used to form the photoconductor or photodiode, thus forming the large area detector. FIG. 24 is a conceptual side sectional view of a multi-module radiation detector 100 in accordance with the present invention. The radiation detector 100 includes a plurality of modules 102, 104, a continuous radiation detecting layer 106, a continuous dielectric layer 108, a continuous top conducting layer 110, and a bottom conducting layer 112.

Although the present invention has been described with reference to preferred embodiments, workers skilled in the art will recognize that changes may be made in form and detail without departing from the spirit and scope of the invention.

What is claimed is:

1. An image capture element comprising:
    a plurality of modules juxtaposed such that each module is disposed adjacent at least one other module to form an array of modules, each of the modules including a dielectric substrate and a plurality of transistors; and
    a continuous radiation detecting layer disposed over the plurality of modules, said radiation detecting layer producing electrical charges representative of a pattern of radiation.

2. An image capture element in accordance with claim 1, wherein the transistors comprise material selected from the group consisting of amorphous silicon, polycrystalline silicon, crystalline silicon and cadmium selenide.

3. The image capture element of claim 1, further comprising:
    a continuous dielectric layer disposed over the radiation detecting layer opposite the modules; and
    a continuous top conducting layer disposed over the dielectric layer opposite the radiation detecting layer.

4. A method for producing an image capture element comprising:
    juxtaposing a plurality of modules such that each module is disposed adjacent at least one other module to form array of the modules, each of said modules including a dielectric substrate and a plurality of transistors; and
    forming a continuous radiation detecting layer over the plurality of modules, said radiation detecting layer producing electric charges representative of a pattern of radiation.

5. The method of claim 4, further comprising the steps of:
    forming a continuous dielectric layer over the radiation detecting layer opposite the modules; and
    forming a continuous top conducting layer over the dielectric layer opposite the radiation detecting layer.

6. An X-ray image capture element comprising:
    a plurality of discrete array modules juxtaposed such that each module is disposed adjacent at least one other module to form a two-dimensional mosaic of modules, each of said modules including a dielectric substrate having a top surface and a bottom surface, and a plurality of transistors arrayed adjacent the top surface of said dielectric substrate; and
    a continuous radiation detecting layer disposed over the plurality of array modules, said radiation detecting layer for producing electrical charges representative of a pattern of incident x-ray radiation.

7. An image capture element in accordance with claim 6, wherein the transistors comprise material selected from the group consisting of amorphous silicon, polycrystalline silicon, crystalline silicon and cadmium selenide.

8. The X-ray image capture element of claim 6, further comprising:
    a continuous dielectric layer disposed over the radiation detecting layer opposite the array modules and coextensive with the radiation detecting layer; and
    a continuous top conducting layer disposed over the dielectric layer opposite the radiation detecting layer and coextensive with the dielectric layer.

9. A solid state radiation detector comprising:
    a plurality of modules disposed adjacent one another in a two-dimensional array, each of the modules including a plurality of transistors; and
    a continuous radiation detecting layer disposed over the modules, the radiation detecting layer generating electrical charge representative of a pattern of radiation.

10. A solid state radiation detector comprising:
    a plurality of modules disposed adjacent one another in a two-dimensional array, each of the modules including a plurality of transistors;
    a continuous radiation detecting layer disposed over the modules, the radiation detecting layer generating electrical charge representative of a pattern of radiation;
    a continuous insulating layer disposed over the radiation detecting layer; and
    a continuous conducting layer disposed over the insulating layer.

11. A radiation detector comprising:
    a plurality of modules disposed adjacent one another, each of the modules including a plurality of transistors; and
    a continuous radiation detecting layer disposed adjacent the modules, the radiation detecting layer generating electrical charge representative of a pattern of radiation.

* * * * *